United States Patent
Maruyama et al.

(10) Patent No.: US 10,043,777 B2
(45) Date of Patent: Aug. 7, 2018

(54) DISPLAY DEVICE

(71) Applicant: Panasonic Liquid Crystal Display Co., Ltd., Hyogo (JP)

(72) Inventors: Junichi Maruyama, Hyogo (JP); Ryutaro Oke, Hyogo (JP); Takashi Nakai, Hyogo (JP); Isamu Shigemoto, Osaka (JP)

(73) Assignee: PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 143 days.

(21) Appl. No.: 15/264,796

(22) Filed: Sep. 14, 2016

(65) Prior Publication Data
US 2017/0077064 A1 Mar. 16, 2017

(30) Foreign Application Priority Data
Sep. 15, 2015 (JP) .................. 2015-181430

(51) Int. Cl.
| | |
|---|---|
| *H01L 25/065* | (2006.01) |
| *G09G 3/20* | (2006.01) |
| *H01L 27/12* | (2006.01) |
| *H01L 23/538* | (2006.01) |
| *G09G 3/36* | (2006.01) |

(52) U.S. Cl.
CPC .......... *H01L 25/0655* (2013.01); *G09G 3/20* (2013.01); *G09G 3/3648* (2013.01); *H01L 23/5386* (2013.01); *H01L 27/124* (2013.01); *G09G 3/3677* (2013.01); *G09G 3/3688* (2013.01); *G09G 2300/0426* (2013.01); *G09G 2310/0281* (2013.01); *G09G 2370/08* (2013.01)

(58) Field of Classification Search
None
See application file for complete search history.

(56) References Cited

U.S. PATENT DOCUMENTS

| | | | | |
|---|---|---|---|---|
| 2003/0234902 | A1* | 12/2003 | Sasaki | G02F 1/13452 349/139 |
| 2004/0179029 | A1* | 9/2004 | Ogawa | G09G 3/3688 345/690 |
| 2010/0033450 | A1* | 2/2010 | Koyama | G06F 3/0412 345/175 |
| 2012/0127405 | A1* | 5/2012 | Lee | G02F 1/13336 349/106 |
| 2012/0154454 | A1 | 6/2012 | Ohishi | |

(Continued)

FOREIGN PATENT DOCUMENTS

JP 2012-128376 7/2012

*Primary Examiner* — Nicholas Lee
(74) *Attorney, Agent, or Firm* — Wenderoth, Lind & Ponack, L.L.P

(57) ABSTRACT

A display device comprises: control circuit substrates disposed in a rear surface of a display panel, a control circuit that generates a control signal in order to control a data line driving circuit and a gate line driving circuit; gate connecting wirings; and a substrate connecting wiring, wherein each of the control circuit substrates includes: a first-side gate connecting part disposed on a first side; and a second-side substrate connecting part disposed on a second side, and the first-side gate connecting part and the second-side substrate connecting part are disposed so as not to overlap each other when the control circuit substrate is viewed in the first direction from the first side toward the second side.

15 Claims, 12 Drawing Sheets

(56) References Cited

U.S. PATENT DOCUMENTS

| | | | | |
|---|---|---|---|---|
| 2014/0028644 A1* | 1/2014 | Sakai | .................. | G02F 1/13452 345/204 |
| 2014/0049533 A1* | 2/2014 | Saitoh | ...................... | G09G 3/20 345/213 |
| 2016/0155391 A1* | 6/2016 | Takesue | ................ | G06F 3/1438 345/690 |

* cited by examiner

DISPLAY DEVICE

CROSS-REFERENCE TO RELATED APPLICATION

This application claims priority from Japanese application JP2015-181430, filed Sep. 15, 2015. This Japanese application is incorporated herein by reference.

TECHNICAL FIELD

The present invention relates to a display device.

BACKGROUND

A display device provided with a display panel such as a liquid crystal panel is used in a television receiver or various monitors. The display device includes the display panel, a video signal line driving circuit (data line driving circuit) that supplies a data signal to a video signal line (data line) of the display panel, a scanning signal line driving circuit (gate line driving circuit) that supplies a scanning signal (gate signal) to a scanning signal line (gate line) of the display panel, and a control circuit that supplies a control signal to each of the driving circuits.

Recently, in association with enlargement of a screen size and high resolution of a display image, there is proposed a technology, in which an image display region is divided into a plurality of regions (divided regions) and the divided regions are driven with a plurality of control circuits (for example, see JP 2012-128376 A).

SUMMARY

However, in the display device including the plurality of control circuits, one control circuit is mounted on one control circuit substrate, and each control circuit substrate is disposed at a position corresponding to each divided region. Therefore, a position of a connecting part (for example, a connector) connecting signal wirings varies according to the control circuit substrate, which results in cost increase of the entire display device.

An object of the present disclosure is to achieve the cost reduction of the display device including the plurality of control circuit substrates.

To solve the above problem, a display device according to the present disclosure comprises: a display panel including a plurality of gate lines extending in a first direction and a plurality of data lines extending in a second direction; a plurality of control circuit substrates disposed in a rear surface of the display panel, each of the control circuit substrates having a control circuit mounted thereon that generates a control signal for controlling at least one of a plurality of data line driving circuits and at least one of a plurality of gate line driving circuits; a plurality of gate connecting wirings each of which electrically connects a respective one of the control circuit substrates to a corresponding one of the gate line driving circuits; and a substrate connecting wiring that electrically connects two of the control circuit substrates which are adjacent to each other, wherein each of the control circuit substrates includes: a first-side gate connecting part disposed on a first side of the control circuit substrate, and capable of being electrically connected to one of the gate connecting wirings; and a second-side substrate connecting part disposed on a second side of the control circuit substrate, and capable of being electrically connected to the substrate connecting wiring, the second side of the control circuit substrate being opposed to the first side of the control circuit substrate, and for each of the control circuit substrates, the first-side gate connecting part and the second-side substrate connecting part are disposed so as not to overlap each other when the control circuit substrate is viewed from the first side of the control circuit substrate toward the second side of the control circuit substrate along the first direction.

In the display device of the present disclosure, each of the control circuit substrates may further include: a first-side substrate connecting part disposed on the first side of the control circuit substrate, and is capable of being electrically connected to the substrate connecting wiring; and a second-side gate connecting part disposed on the second side of the control circuit substrate, and is capable of being electrically connected to the gate connecting wiring.

In the display device of the present disclosure, the two control circuit substrates which are adjacent to each other may be electrically connected to each other through the substrate connecting wiring electrically connected to one of the first-side substrate connecting part and the second-side substrate connecting part, and in each of the control circuit substrates, the gate connecting wiring is electrically connected to one of the first-side gate connecting part and the second-side gate connecting part, and the gate connecting wiring is not electrically connected to the other of the first-side gate connecting part and the second-side gate connecting part.

In the display device of the present disclosure, each of the control circuit substrates may further comprise a third-side substrate connecting part disposed on a third side of the control circuit substrate, the third side of the control circuit substrate extending from the first side of the control circuit substrate to the second side of the control circuit substrate, and the third-side substrate connecting part capable of being electrically connected to the substrate connecting wiring, wherein the two control circuit substrates which are adjacent to each other are electrically connected to each other through the substrate connecting wiring electrically connected to at least one of the first-side substrate connecting part, the second-side substrate connecting part, and the third-side substrate connecting part, and in each of the control circuit substrates, the substrate connecting wiring is not electrically connected to one or two of the first-side substrate connecting part, the second-side substrate connecting part, and the third-side substrate connecting part.

In the display device of the present disclosure, the third-side substrate connecting part may include two substrate connecting parts arrayed along the third side of the control circuit substrate, and in each of the control circuit substrates, the substrate connecting wiring is electrically connected to one of the two substrate connecting parts, and the substrate connecting wiring is not electrically connected to the other of the two substrate connecting parts.

The display device of the present disclosure may further comprise a plurality of data connecting wirings each of which electrically connects, for each of the control circuit substrates, the control circuit substrate and the data line driving circuit to each other, wherein each of the control circuit substrates further includes a data connecting part that is disposed on a fourth side of the control circuit substrate, the fourth side of the control circuit substrate extending from the first side of the control circuit substrate to the second side of the control circuit substrate, the data connecting wiring being electrically connected to the data connecting part, and in each of the control circuit substrates, the data connecting part is symmetrically disposed in relation to a center line of a direction of the fourth side of the control circuit substrate, the first-side gate connecting part and the second-side gate connecting part are symmetrically disposed in relation to the center line of the direction of the fourth side of the control circuit substrate, and the first-side substrate connecting part and the second-side substrate connecting part are symmetrically disposed in relation to the center line of the direction of the fourth side of the control circuit substrate.

In the display device of the present disclosure, the plurality of control circuit substrates may include a first control circuit substrate and a second control circuit substrate, the first control circuit substrate and the second control circuit substrate are adjacent to each other in the first direction, and are disposed such that the first side of the first control circuit substrate and the second side of the second control circuit substrate face each other, and the first control circuit substrate and the second control circuit substrate are disposed such that positions of the first-side gate connecting part, the second-side gate connecting part, the first-side substrate connecting part, and the second-side substrate connecting part in the first control circuit substrate and positions of the first-side gate connecting part, the second-side gate connecting part, the first-side substrate connecting part, and the second-side substrate connecting part in the second control circuit substrate are translated to each other in the first direction.

In the display device of the present disclosure, the plurality of control circuit substrates may include a first control circuit substrate and a second control circuit substrate, the first control circuit substrate and the second control circuit substrate are adjacent to each other in the second direction, and are disposed such that the third side of the first control circuit substrate and the third side of the second control circuit substrate face each other, and the first control circuit substrate and the second control circuit substrate are disposed such that positions of the first-side gate connecting part, the second-side gate connecting part, the first-side substrate connecting part, and the second-side substrate connecting part in the first control circuit substrate and positions of the first-side gate connecting part, the second-side gate connecting part, the first-side substrate connecting part, and the second-side substrate connecting part in the second control circuit substrate are symmetrical about a point.

The display device of the present disclosure may further comprise: a plurality of data line driving circuit substrates on each of which is mounted a respective one of the data line driving circuits; and a plurality of gate line driving circuit substrates on each of which is mounted a respective one of the gate line driving circuits, wherein each of the data line driving circuit substrates is symmetrically formed in relation to a center line in the first direction, and each of the gate line driving circuit substrates is symmetrically formed in relation to the center line in the first direction.

In the display device of the present disclosure, one of the plurality of control circuit substrates may include a timing signal generating circuit that generates a timing signal in order to synchronize operations of the plurality of control circuits mounted on the plurality of control circuit substrates with each other, and each of the control circuits of the plurality of control circuit substrates operates based on the generated timing signal.

In the display device of the present disclosure, a specific component may be mounted on one of the plurality of control circuit substrates, and the specific component may be not mounted on other ones of the plurality of control circuit substrates.

In the display device of the present disclosure, the specific component may be a timing signal generating circuit that generates a timing signal in order to synchronize operations of the plurality of control circuits mounted on the plurality of control circuit substrates with each other.

In the display device of the present disclosure, each of the control circuit substrates may include a timing signal generating circuit that generates a timing signal in order to synchronize operations of the plurality of control circuits mounted on the plurality of control circuit substrates, a function of the timing signal generating circuit mounted on one of the plurality of control circuit substrates is enabled, and functions of the timing signal generating circuits mounted on other ones of the plurality of control substrate circuits are disabled.

Another display device of the present disclosure comprises: a display panel including a plurality of gate lines extending in a first direction and a plurality of data lines extending in a second direction; four control circuit substrates arranged in a matrix shape in the first and second directions in a rear surface of the display panel, each of the control circuit substrates having a control circuit mounted thereon that generates a control signal for controlling at least one of a plurality of data line driving circuits and at least one of a plurality of gate line driving circuits; a plurality of gate connecting wirings each of which electrically connects a respective one of the control circuit substrates to a corresponding one of the gate line driving circuits; and a plurality of substrate connecting wirings that electrically connect two of the control circuit substrates which are adjacent to each other in the second direction, and electrically connect two of the control circuit substrates which are adjacent to each other in the first direction, wherein each of the control circuit substrates includes: a first-side gate connecting part and a first-side substrate connecting part, the first-side gate connecting part and the first-side substrate connecting part being disposed on a first side of the control circuit substrate, the first-side gate connecting part being capable of being electrically connected to the gate connecting wirings, the first-side substrate connecting part being capable of electrically connected to the substrate connecting wiring; a second-side gate connecting part and a second-side substrate connecting part, the second-side gate connecting part and the second-side substrate connecting part being disposed on a second side of the control circuit substrate facing the first side of the control circuit substrate, the second-side gate connecting part being capable of being electrically connected to the gate connecting wiring, the second-side substrate connecting part being capable of being electrically connected to the substrate connecting wiring; and a third-side substrate connecting part disposed on a third side of the control circuit substrate which extends from the first side of the control circuit substrate to the second side of the control circuit substrate, the third-side substrate connecting part being electrically connected to the substrate connecting wiring, the two control circuit substrates which are adjacent to each other in the second direction are electrically connected to each other through the substrate connecting wiring electrically connected to the third-side substrate connecting part, and in each of the control circuit substrates, the gate connecting wiring is electrically connected to one of the first-side gate connecting part and the second-side gate connecting part, and the gate connecting wiring is not electrically connected to the other of the first-side gate connecting part and the second-side gate connecting part, and the substrate connecting wiring is electrically connected to one of the first-side substrate connecting part and the second-side substrate connecting part, and the substrate connecting wiring is not electrically connected to the other of the first-side substrate connecting part and the second-side substrate connecting part.

In the another display device of the present disclosure, in each of the control circuit substrates, when the gate connecting wiring is electrically connected to the first-side gate connecting part while not electrically connected to the second-side gate connecting part, the substrate connecting wiring may be electrically connected to the second-side substrate connecting part, while not electrically connected to the first-side substrate connecting part, and when the gate connecting wiring is electrically connected to the second-side gate connecting part while not electrically connected to the first-side gate connecting part, the substrate connecting wiring is electrically connected to the first-side substrate connecting part, while not electrically connected to the second-side substrate connecting part.

In the display device of the present disclosure, the cost reduction of the display device including the plurality of control circuit substrates can be achieved.

DETAILED DESCRIPTION

Hereinafter, an exemplary embodiment of the present disclosure will be described with reference to the drawings. In the exemplary embodiment, a liquid crystal display device is described as an example of display device. However the display device according to the present disclosure is not limited to the liquid crystal display device. For example the present disclosure may be an organic electroluminescence display (OLED) device.

Figure 1:
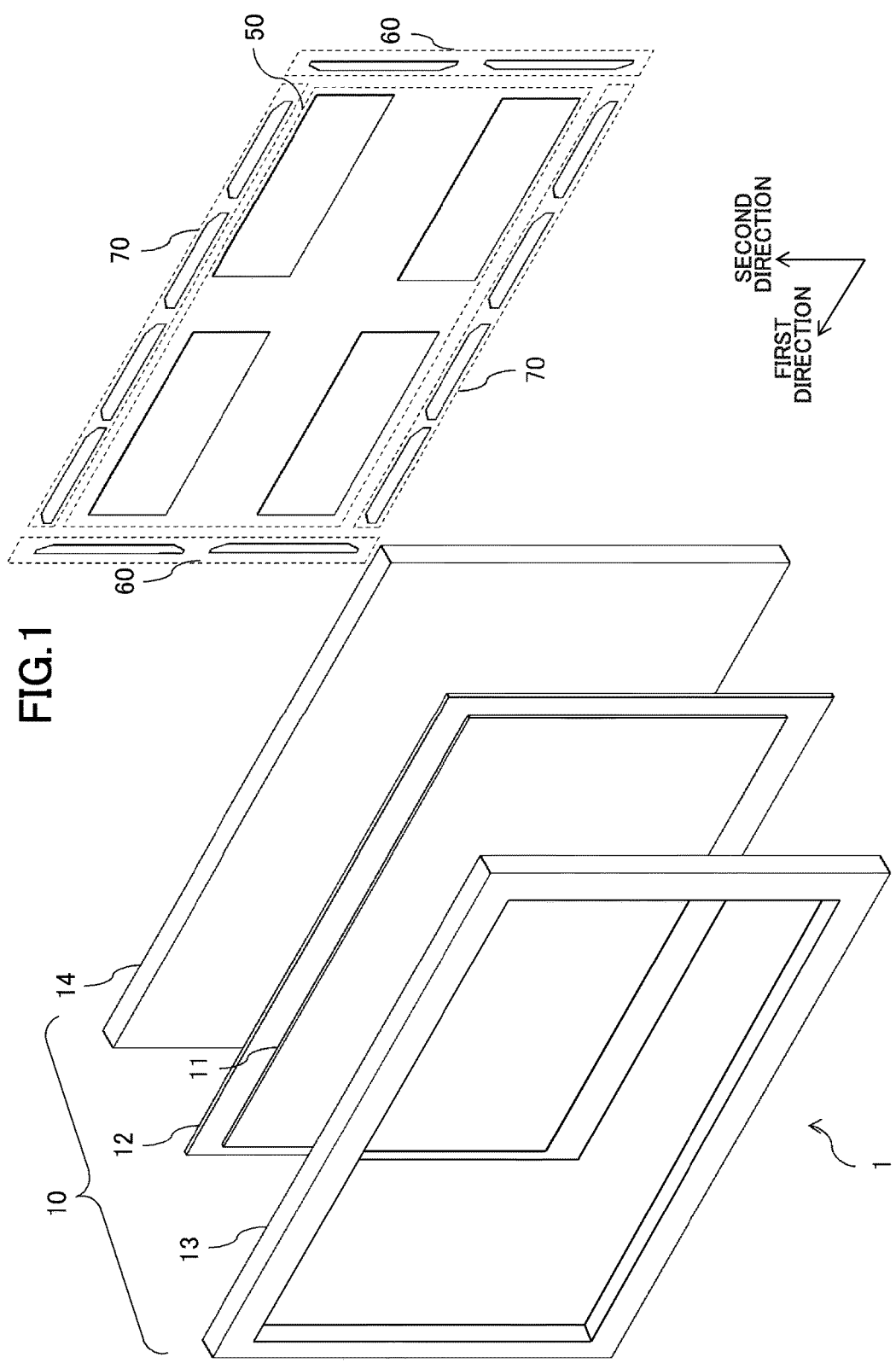
FIG. 1 is a perspective view illustrating an entire configuration of a liquid crystal display device according to an exemplary embodiment.

FIG. 1 is a perspective view illustrating an entire configuration of liquid crystal display device 1 according to an exemplary embodiment. As illustrated in FIG. 1, liquid crystal display device 1 includes display panel 10 that displays an image, a plurality of control circuit substrates 50 on which control circuit 240 (see FIG. 2) is mounted, a plurality of gate line driving circuit substrates 60 on which gate line driving circuit 610 (see FIG. 2) is mounted, and a plurality of data line driving circuit substrates 70 on which data line driving circuit 710 (see FIG. 2) is mounted. Display panel 10 includes counter substrate (first substrate) 11, TFT (Thin Film Transistor) substrate (second substrate) 12, a liquid crystal layer (not illustrated) sandwiched between the substrates, upper frame 13 disposed on a front surface side (display surface side) of counter substrate 11, and lower frame 14 disposed on a rear surface side of TFT substrate 12. For example, a backlight that emits light is provided on the rear surface side of TFT substrate 12. The plurality of control circuit substrates 50, the plurality of gate line driving circuit substrates 60, and the plurality of data line driving circuit substrates 70 are disposed in the rear surface of display panel 10.

Although not illustrated, a plurality of gate lines, a plurality of data lines, a plurality of thin film transistors (TFTs) and a plurality of pixel electrodes, and a common electrode are formed in TFT substrate 12. The plurality of gate lines extend in a first direction (for example, a row direction). The plurality of data lines intersect the plurality of gate lines with an insulator interposed therebetween, and extend in a second direction (for example, a column direction) orthogonal to the first direction. The TFT and the pixel electrode are arranged in an image region surrounded by two adjacent gate lines and two adjacent data lines. For example, a color filter and a black matrix are formed in counter substrate 11. Known configurations can be applied to TFT substrate 12 and counter substrate 11.

Gate line driving circuit 610 supplies a gate signal to each of the plurality of gate lines. Data line driving circuit 710 supplies a data signal to each of the plurality of data lines. The plurality of gate line driving circuit substrates 60 are arranged in line in the second direction on right and left sides in a rear surface of display panel 10. The plurality of data line driving circuit substrates 70 are arranged in line in the first direction on top and bottom sides in the rear surface of display panel 10. The plurality of gate line driving circuit substrates 60 and the plurality of data line driving circuit substrates 70 are arranged along sides of an outline in the rear surface of display panel 10. Control circuit substrate 50 is disposed along gate line driving circuit substrate 60 and data line driving circuit substrate 70 in the rear surface of display panel 10. The plurality of gate line driving circuit substrates 60 may be arranged in line in the second direction on one of the right and left sides in the rear surface of display panel 10. The plurality of data line driving circuit substrates 70 may be arranged in line in the first direction on one of the top and bottom sides in the rear surface of display panel 10.

Figure 2:
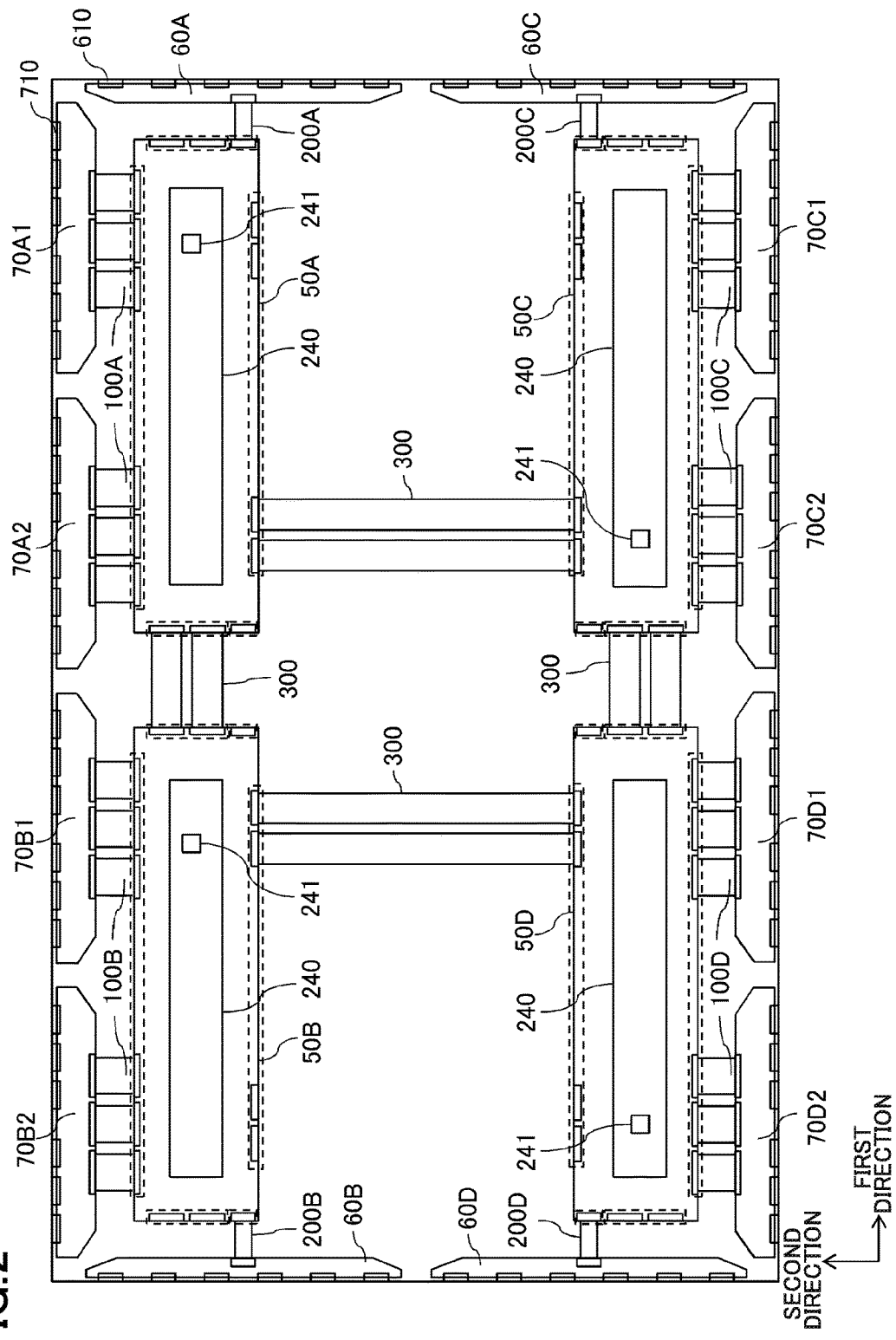
FIG. 2 is a rear view illustrating a display panel of the exemplary embodiment.

FIG. 2 is a rear view illustrating display panel 10. FIG. 2 illustrates an example in which four control circuit substrates 50 (50A to 50D), four gate line driving circuit substrates 60 (60A to 60D), eight data line driving circuit substrates 70 (70A1 to 70D1, 70A2 to 70D2) are arrange in the rear surface of display panel 10. As illustrated in FIG. 2, four control circuit substrates 50 are arranged into a matrix shape in the first and second directions. Each control circuit substrate 50 is electrically connected to data line driving circuit substrate 70 through data connecting wiring 100 (100A to 100D). Each control circuit substrate 50 is electrically connected to gate line driving circuit substrate 60 through gate connecting wiring 200 (200A to 200D). Two adjacent control circuit substrates 50 are electrically connected to each other through substrate connecting wiring 300.

Hereinafter, an upper right, an upper left, a lower right, and a lower left of four control circuit substrates 50 arranged in the rear surface of display panel 10 are sequentially referred to as control circuit substrate 50A, control circuit substrate 50B, control circuit substrate 50C, and control circuit substrate 50D when viewed from the rear surface of display panel 10. Control circuit substrates 50A to 50D have the substantially same shape. An upper right, an upper left, a lower right, and a lower left of four gate line driving circuit substrates 60 arranged in the rear surface of display panel 10 are sequentially referred to as gate line driving circuit substrate 60A, gate line driving circuit substrate 60B, gate line driving circuit substrate 60C, and gate line driving circuit substrate 60D when viewed from the rear surface of display panel 10. Gate line driving circuit substrates 60A to 60D have the substantially same shape. When viewed from the rear surface of display panel 10, eight data line driving circuit substrates 70 arranged in the rear surface of display panel 10 are referred to as data line driving circuit substrate 70A1, data line driving circuit substrate 70A2, data line driving circuit substrate 70B1, and data line driving circuit substrate 70B2 in the order from the right side of the top side, and referred to as data line driving circuit substrate 70C1, data line driving circuit substrate 70C2, data line driving circuit substrate 70D1, and data line driving circuit substrate 70D2 in the order from the right side of the bottom side. Data line driving circuit substrates 70A1 to 70D2 have substantially the same shape.

A specific configuration of control circuit substrate 50 will be described below with control circuit substrate 50A as an example.

Figure 3:
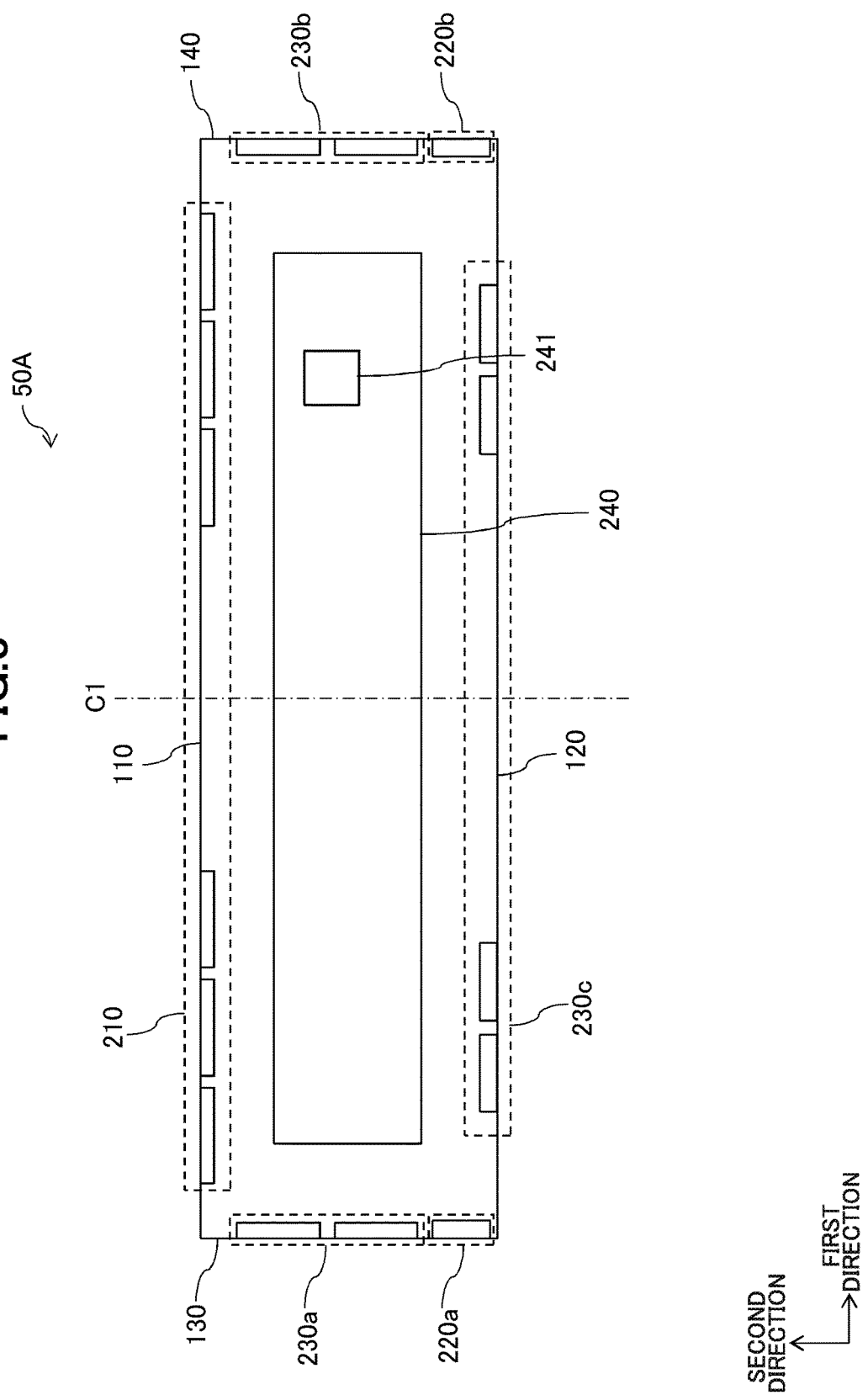
FIG. 3 is a view illustrating a schematic configuration of a control circuit substrate of the exemplary embodiment.

FIG. 3 is a view illustrating a schematic configuration of a control circuit substrate 50A. Control circuit substrate 50A is a substantially rectangular printed circuit substrate including four sides from a first side to a fourth side. For example, as illustrated in FIG. 3, control circuit substrate 50A is a substantially rectangular printed circuit substrate including two short sides (the first side and the second side) extending in the second direction and two long sides (the third side and the fourth side) each of which connects the two short sides to each other while extending in the first direction. For example, control circuit substrate 50A includes data connecting part 210, gate connecting part 220 (first gate connecting part 220a, second gate connecting part 220b), and substrate connecting part 230 (first substrate connecting part 230a, second substrate connecting part 230b, third substrate connecting part 230c).

Data connecting part 210 is a region, which is disposed on the side of first long side 110 (corresponds to the fourth side) of control circuit substrate 50A, and connected to one or the plurality of data connecting wirings 100 that electrically connect control circuit substrate 50A and data line driving circuit 710 to each other. Data connecting part 210 may include a plurality of data connecting parts. Data connecting part 210 may be a terminal (connector) to which data connecting wiring 100 is connected or a region where the terminal is mounted.

Gate connecting part 220 is a region that is connected to one or the plurality of gate connecting wirings 200 that electrically connect control circuit substrate 50A and gate line driving circuit 610 to each other. Gate connecting part 220 includes first gate connecting part 220a and second gate connecting part 220b. First gate connecting part 220a is disposed on the side of first short side 130 (corresponds to the first side or the second side) of control circuit substrate 50A. Second gate connecting part 220b is disposed on the side of second short side 140 (corresponds to the first side or the second side) facing first short side 130 of control circuit substrate 50A. Each of first gate connecting part 220a and second gate connecting part 220b may include a plurality of gate connecting parts. Gate connecting part 220 may be a terminal (connector) to which gate connecting wiring 200 is connected or a region where the terminal is mounted.

Substrate connecting part 230 is a region that is connected to one or the plurality of substrate connecting wirings 300 that electrically connect adjacent control circuit substrates 50 to each other. Substrate connecting part 230 includes first substrate connecting part 230a, second substrate connecting part 230b, and third substrate connecting part 230c. First substrate connecting part 230a is disposed on the side of first short side 130 (corresponds to the first side or the second side) of control circuit substrate 50A. Second substrate connecting part 230b is disposed on the side of second short side 140 (corresponds to the first side or the second side) of control circuit substrate 50A. Third substrate connecting part 230c is disposed on the side of second long side 120 (corresponds to the third side) facing first long side 110 of control circuit substrate 50A. Each of first substrate connecting part 230a, second substrate connecting part 230b, and third substrate connecting part 230c may include a plurality of substrate connecting parts. Substrate connecting part 230 may be a terminal (connector) to which substrate connecting wiring 300 is connected or a region where the terminal is mounted.

For example, control circuit 240 generates a control signal in order to control gate line driving circuit 610 and data line driving circuit 710. For example, control circuit 240 includes specific component 241 such as a timing controller.

In control circuit substrate 50A of FIG. 3, data connecting part 210, gate connecting part 220, and substrate connecting part 230 are symmetrically disposed in relation to center line Cl in a long side direction (the first direction) of control circuit substrate 50A. Specifically, as illustrated in FIG. 3, first gate connecting part 220a and second gate connecting part 220b are symmetrically disposed in relation to center line C1. First substrate connecting part 230a and second substrate connecting part 230b are symmetrically disposed in relation to center line C1. On the side of first short side 130 in FIG. 3, the positions of first gate connecting part 220a and first substrate connecting part 230a may be replaced with each other. In such cases, on the side of second short side 140, the positions of first gate connecting part 220a and first substrate connecting part 230a are also replaced with each other. When control circuit substrate 50A is viewed in the long side direction (the first direction) from first short side 130 toward second short side 140, first gate connecting part 220a and second substrate connecting part 230b are disposed so as not to overlap each other. That is, first gate connecting part 220a and second substrate connecting part 230b do not superpose each other in the direction (the first direction) perpendicular to first short side 130. When control circuit substrate 50A is viewed in the long side direction (the first direction) from first short side 130 toward second short side 140, second gate connecting part 220b and first substrate connecting part 230a are disposed so as not to overlap each other. That is, second gate connecting part 220b and first substrate connecting part 230a do not superpose each other in the direction (the first direction) perpendicular to first short side 130.

In the case that data connecting part 210 includes the plurality of data connecting parts, the plurality of data connecting parts are also symmetrically disposed in relation to center line C1 in the long side direction (the first direction) of control circuit substrate 50A. The same holds true for first gate connecting part 220a, second gate connecting part 220b, first substrate connecting part 230a, second substrate connecting part 230b, and third substrate connecting part 230c.

In FIG. 3, control circuit substrate 50A has the substantially rectangular shape. However, control circuit substrate 50A may have any shape as long as each part of control circuit substrate 50A is symmetrically disposed in relation to center line C1 in the first direction.

The control circuit substrate 50A is described above by way of example, and each of control circuit substrates 50B to 50D also has the configuration similar to control circuit substrate 50A.

In the exemplary embodiment, the plurality of control circuit substrates 50 in FIG. 3 are arranged in the rear surface of display panel 10. A specific configuration in which the plurality of control circuit substrates 50 are arranged in the rear surface of display panel 10 will be described below.

A configuration in which the plurality of control circuit substrates 50 adjacent to each other in the first direction will be described below with two control circuit substrates 50 (control circuit substrates 50A and 50B in FIG. 2) adjacent to each other in the first direction as an example. Although control circuit substrates 50A and 50B in FIG. 2 are cited as an example, the same holds true for control circuit substrates 50C and 50D.

Figure 4:
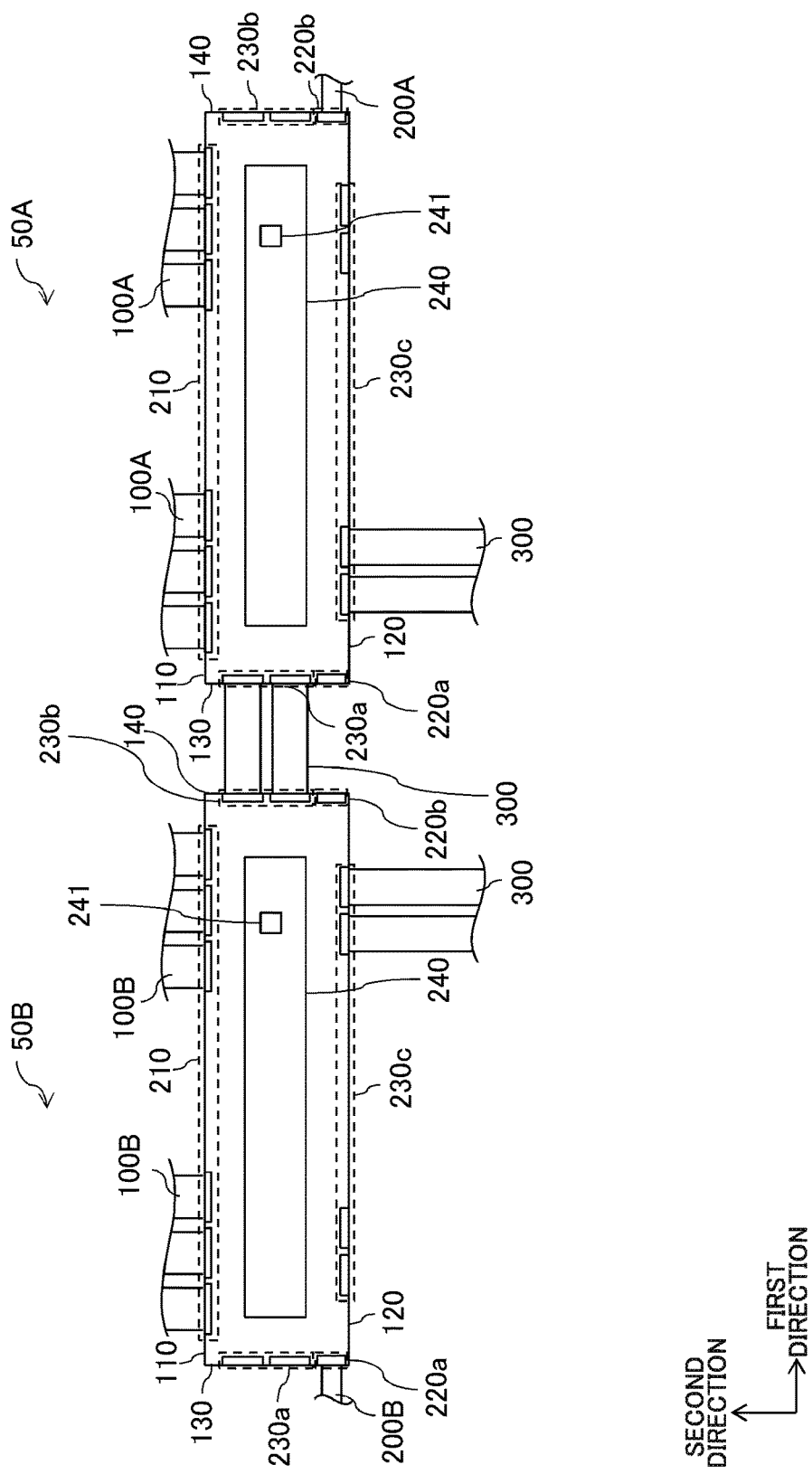
FIG. 4 is a view illustrating a schematic configuration of a plurality of control circuit substrates adjacent to each other in a first direction of the exemplary embodiment.

FIG. 4 is a view illustrating a schematic configuration of the plurality of control circuit substrates 50 adjacent to each other in the first direction. For convenience, only control circuit substrates 50A and 50B in FIG. 2 and the wirings connected to the control circuit substrates of control circuit substrates 50A and 50B are illustrated in FIG. 4. As illustrated in FIG. 4, two control circuit substrates 50A and 50B adjacent to each other in the first direction are disposed such that first short side 130 of control circuit substrate 50A and second short side 140 of control circuit substrate 50B face each other. Control circuit substrates 50A and 50B are disposed such that the positions of data connecting part 210, gate connecting part 220, and substrate connecting part 230 in control circuit substrate 50A and the positions of data connecting part 210, gate connecting part 220, and substrate connecting part 230 in control circuit substrate 50B are translated to each other in the first direction.

Specifically, data connecting part 210 of control circuit substrate 50A is electrically connected to data line driving circuit 710 through data connecting wiring 100A. Second gate connecting part 220b of control circuit substrate 50A is electrically connected to gate line driving circuit 610 through gate connecting wiring 200A. On the other hand, the gate connecting wiring is not connected to first gate connecting part 220a of control circuit substrate 50A, but first gate connecting part 220a is in a non-use state. Third substrate connecting part 230c of control circuit substrate 50A is electrically connected to control circuit substrate 50C through substrate connecting wiring 300. Data connecting part 210 of control circuit substrate 50B is electrically connected to data line driving circuit 710 through data connecting wiring 100B. First gate connecting part 220a of control circuit substrate 50B is electrically connected to gate line driving circuit 610 through gate connecting wiring 200B. On the other hand, the gate connecting wiring is not connected to second gate connecting part 220b of control circuit substrate 50B, but second gate connecting part 220b is in the non-use state. Third substrate connecting part 230c of control circuit substrate 50B is electrically connected to control circuit substrate 50D through substrate connecting wiring 300. First substrate connecting part 230a of control circuit substrate 50A and second substrate connecting part 230b of control circuit substrate 50B are electrically connected to each other through substrate connecting wiring 300. On the other hand, substrate connecting wiring 300 is not connected to second substrate connecting part 230b of control circuit substrate 50A and first substrate connecting part 230a of control circuit substrate 50B, but second substrate connecting part 230b and first substrate connecting part 230a are in the non-use state. Third substrate connecting part 230c of control circuit substrate 50A and third substrate connecting part 230c of control circuit substrate 50B may electrically be connected to each other through substrate connecting wiring 300.

In each of control circuit substrates 50A and 50B adjacent to each other in the first direction, the gate connecting wiring is electrically connected to one of first gate connecting part 220a and second gate connecting part 220b, but the gate connecting wiring is not electrically connected to the other.

In each of control circuit substrates 50A and 50B adjacent to each other in the first direction, substrate connecting wiring 300 is not electrically connected to one of first substrate connecting part 230a, second substrate connecting part 230b, and third substrate connecting part 230c.

The number of control circuit substrates 50 arrayed in the first direction is not limited two, but at least three control circuit substrates 50 may be arrayed. For example, in the case that three control circuit substrates 50 are arrayed in the first direction, control circuit substrates 50 are identical to one another in the dispositions of data connecting part 210, gate connecting part 220, and substrate connecting part 230. In two adjacent control circuit substrates 50, first substrate connecting part 230a of one of control circuit substrates 50 and second substrate connecting part 230b of the other are electrically connected to each other through substrate connecting wiring 300. In this case, in two control circuit substrates 50 at both ends, the gate connecting wiring is electrically connected to one of first gate connecting part 220a and second gate connecting part 220b, and the gate connecting wiring is not electrically connected to the other. In remaining (central) control circuit substrate 50, the gate connecting wiring is electrically connected to neither first gate connecting part 220a nor second gate connecting part 220b. In two control circuit substrates 50 at both the ends, substrate connecting wiring 300 is electrically connected to one of first substrate connecting part 230a, second substrate connecting part 230b, and third substrate connecting part 230c. In remaining (central) control circuit substrate 50, substrate connecting wiring 300 is electrically connected to neither first substrate connecting part 230a nor second substrate connecting part 230b.

A configuration in which the plurality of control circuit substrates 50 adjacent to each other in the second direction will be described below with two control circuit substrates 50 (control circuit substrates 50A and 50C in FIG. 2) adjacent to each other in the second direction as an example. Although control circuit substrates 50A and 50C in FIG. 2 are cited as an example, the same holds true for control circuit substrates 50B and 50D.

Figure 5:
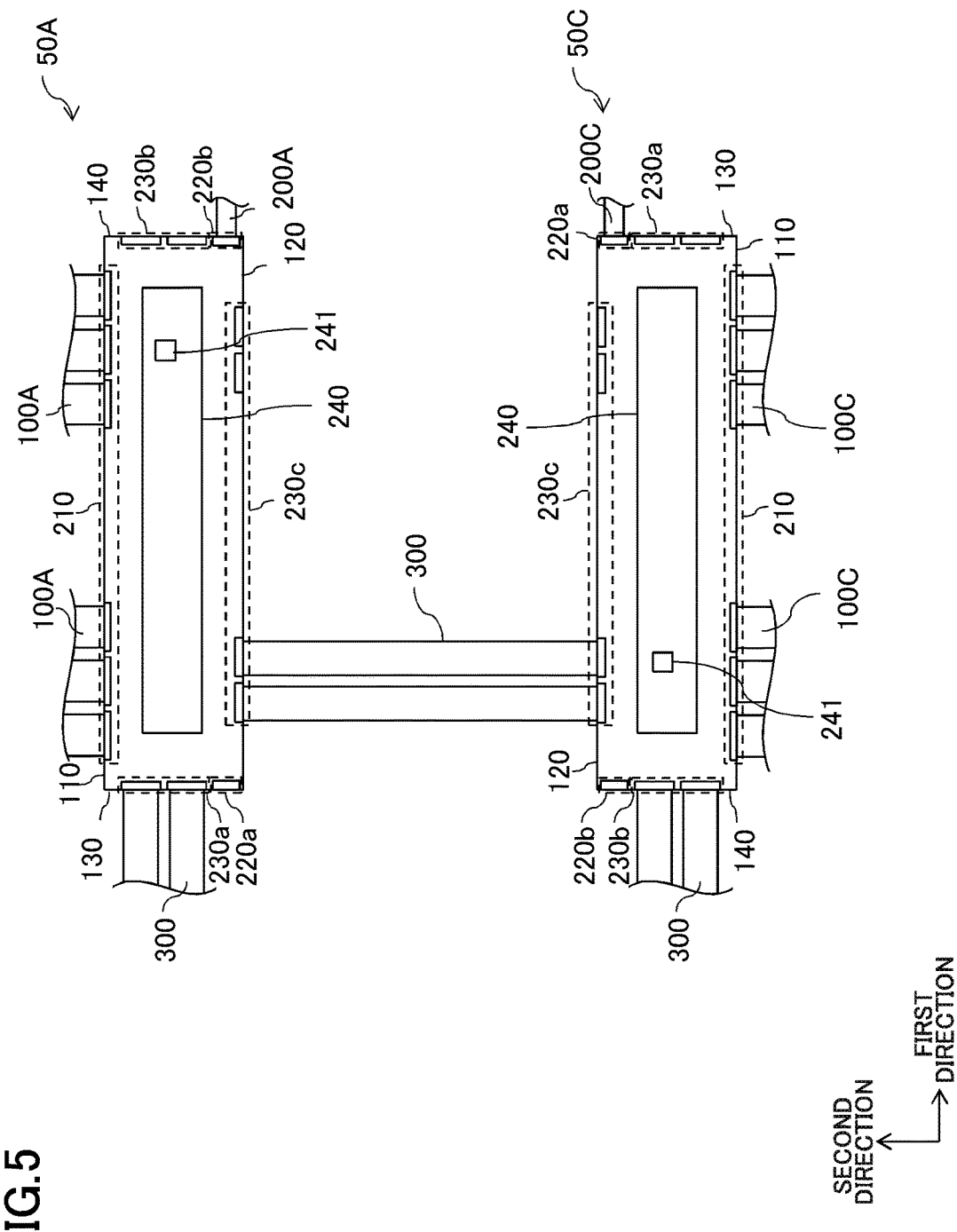
FIG. 5 is a view illustrating a schematic configuration of the plurality of control circuit substrates adjacent to each other in a second direction of the exemplary embodiment.

FIG. 5 is a view illustrating a schematic configuration of the plurality of control circuit substrates 50 adjacent to each other in the second direction. For convenience, only control circuit substrates 50A and 50C in FIG. 2 and the wirings connected to the control circuit substrates of control circuit substrates 50A and 50C are illustrated in FIG. 5. As illustrated in FIG. 5, two control circuit substrates 50A and 50C adjacent to each other in the second direction are disposed such that second long side 120 of control circuit substrate 50A and second long side 120 of control circuit substrate 50C face each other. Control circuit substrates 50A and 50C are disposed such that the positions of data connecting part 210, gate connecting part 220, and substrate connecting part 230 in control circuit substrate 50A and the positions of data connecting part 210, gate connecting part 220, and substrate connecting part 230 in control circuit substrate 50C are symmetrical about a point.

Specifically, data connecting part 210 of control circuit substrate 50A is electrically connected to data line driving circuit 710 through data connecting wiring 100A. Second gate connecting part 220b of control circuit substrate 50A is electrically connected to gate line driving circuit 610 through gate connecting wiring 200A. On the other hand, the gate connecting wiring is not electrically connected to first gate connecting part 220a of control circuit substrate 50A, but first gate connecting part 220a is in the non-use state. First substrate connecting part 230a of control circuit substrate 50A is electrically connected to control circuit substrate 50B through substrate connecting wiring 300. Substrate connecting wiring 300 is not connected to second substrate connecting part 230b of control circuit substrate 50A, but second substrate connecting part 230b is in the non-use state. Data connecting part 210 of control circuit substrate 50C is electrically connected to data line driving circuit 710 through data connecting wiring 100C. First gate connecting part 220a of control circuit substrate 50C is electrically connected to gate line driving circuit 610 through gate connecting wiring 200C. On the other hand, the gate connecting wiring is not electrically connected to second gate connecting part 220b of control circuit substrate 50C, but second gate connecting part 220b is in the non-use state. Second substrate connecting part 230b of control circuit substrate 50C is electrically connected to control circuit substrate 50D through substrate connecting wiring 300. Substrate connecting wiring 300 is not connected to first substrate connecting part 230a of control circuit substrate 50C, but first substrate connecting part 230a is in the non-use state. Third substrate connecting part 230c of control circuit substrate 50A and third substrate connecting part 230c of control circuit substrate 50C are electrically connected to each other through substrate connecting wiring 300. First substrate connecting part 230a or second substrate connecting part 230b of control circuit substrate 50A, and first substrate connecting part 230a or second substrate connecting part 230b of control circuit substrate 50C may electrically be connected to each other through substrate connecting wiring 300.

In each of control circuit substrates 50A and 50C adjacent to each other in the second direction, the gate connecting wiring is electrically connected to one of first gate connecting part 220a and second gate connecting part 220b, and the gate connecting wiring is not electrically connected to the other.

In each of control circuit substrates 50A and 50C adjacent to each other in the second direction, substrate connecting wiring 300 is not electrically connected to one of first substrate connecting part 230a, second substrate connecting part 230b, and third substrate connecting part 230c.

Figure 6:
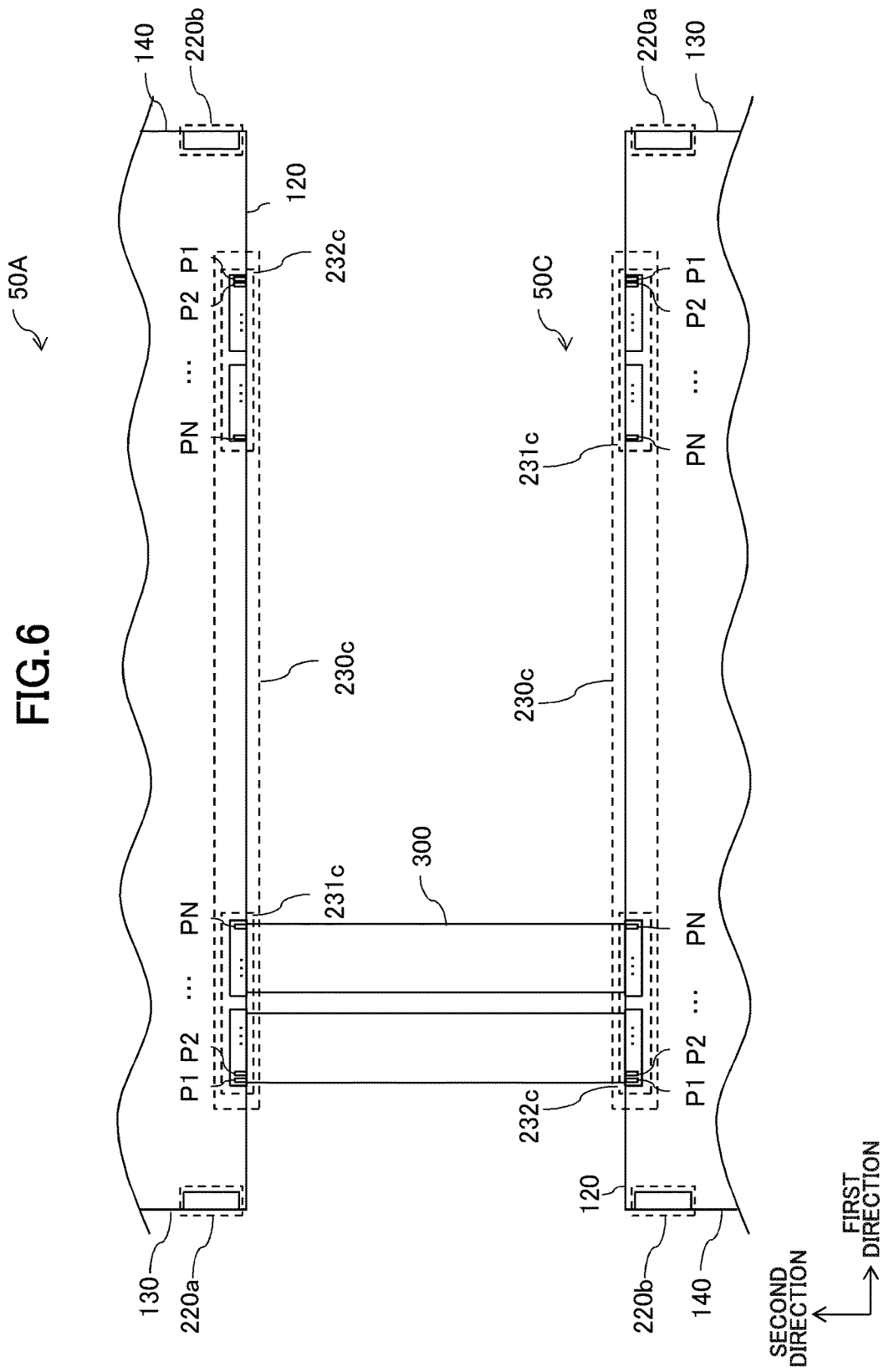
FIG. 6 is a view illustrating a schematic configuration of a third substrate connecting part of the plurality of control circuit substrates adjacent to each other in the second direction of the exemplary embodiment.

As illustrated in FIG. 6, each of third substrate connecting parts 230c of control circuit substrates 50A and 50C may include two substrate connecting parts (fourth substrate connecting part 231c and fifth substrate connecting part 232c) adjacent to each other in the first direction. FIG. 6 is a view illustrating third substrate connecting part 230c of the plurality of control circuit substrates 50 (control circuit substrates 50A and 50C) adjacent to each other in the second direction shown in FIG. 5. Fourth substrate connecting part 231c and fifth substrate connecting part 232c are arranged along second long side 120. In this case, in each of control circuit substrates 50A and 50C, preferably a pin array of fourth substrate connecting part 231c and a pin array of fifth substrate connecting part 232c are formed in the reverse order. That is, the pin array formed in fourth substrate connecting part 231c is set to P1 to PN (N is a natural number) from the side of first short side 130, and the pin array formed in fifth substrate connecting part 232c is set to P1 to PN from the side of second short side 140. The pin array formed in fourth substrate connecting part 231c of control circuit substrate 50A and the pin array formed in fifth substrate connecting part 232c of control circuit substrate 50C are aligned in the second direction. Therefore, fourth substrate connecting part 231c of control circuit substrate 50A and fifth substrate connecting part 232c of control circuit substrate 50C are easily connected to each other. Similarly, the pin array formed in fifth substrate connecting part 232c of control circuit substrate 50A and the pin array formed in fourth substrate connecting part 231c of control circuit substrate 50C are aligned in the second direction. Therefore, fifth substrate connecting part 232c of control circuit substrate 50A and fourth substrate connecting part 231c of control circuit substrate 50C may be connected to each other through substrate connecting wiring 300.

As illustrated in FIG. 2, four control circuit substrates 50 can be arranged in liquid crystal display device 1 by applying the configuration of the dispositions of the plurality of control circuit substrates 50 adjacent to each other in the first direction in FIG. 4 and the configuration of the dispositions of the plurality of control circuit substrates 50 adjacent to each other in the second direction in FIG. 5. In liquid crystal display device 1 in which four control circuit substrates 50 are arranged into the matrix shape in the first and second directions, the two control circuit substrates adjacent in the second direction are electrically connected to each other through substrate connecting wiring 300 electrically connected to third substrate connecting part 230c. In each of the four control circuit substrates, the gate connecting wiring is electrically connected to one of first gate connecting part 220a and second gate connecting part 220b, and the gate connecting wiring is not electrically connected to the other, and substrate connecting wiring 300 is electrically connected to one of first substrate connecting part 230a and second substrate connecting part 230b, and substrate connecting wiring 300 is not electrically connected to the other.

In each of the four control circuit substrates, in the case that the gate connecting wiring is electrically connected to first gate connecting part 220a while not electrically connected to second gate connecting part 220b, substrate connecting wiring 300 is electrically connected to second substrate connecting part 230b, and substrate connecting wiring 300 is not electrically connected to first substrate connecting part 230a. On the other hand, in the case that the gate connecting wiring is electrically connected to second gate connecting part 220b while not electrically connected to first gate connecting part 220a, substrate connecting wiring 300 is electrically connected to first substrate connecting part 230a, and substrate connecting wiring 300 is not electrically connected to second substrate connecting part 230b.

Thus, production cost of liquid crystal display device 1 can be suppressed by arranging the plurality of control circuit substrates 50 that have substantially the same shape and the similar configuration as illustrated in FIG. 2.

Figure 7:
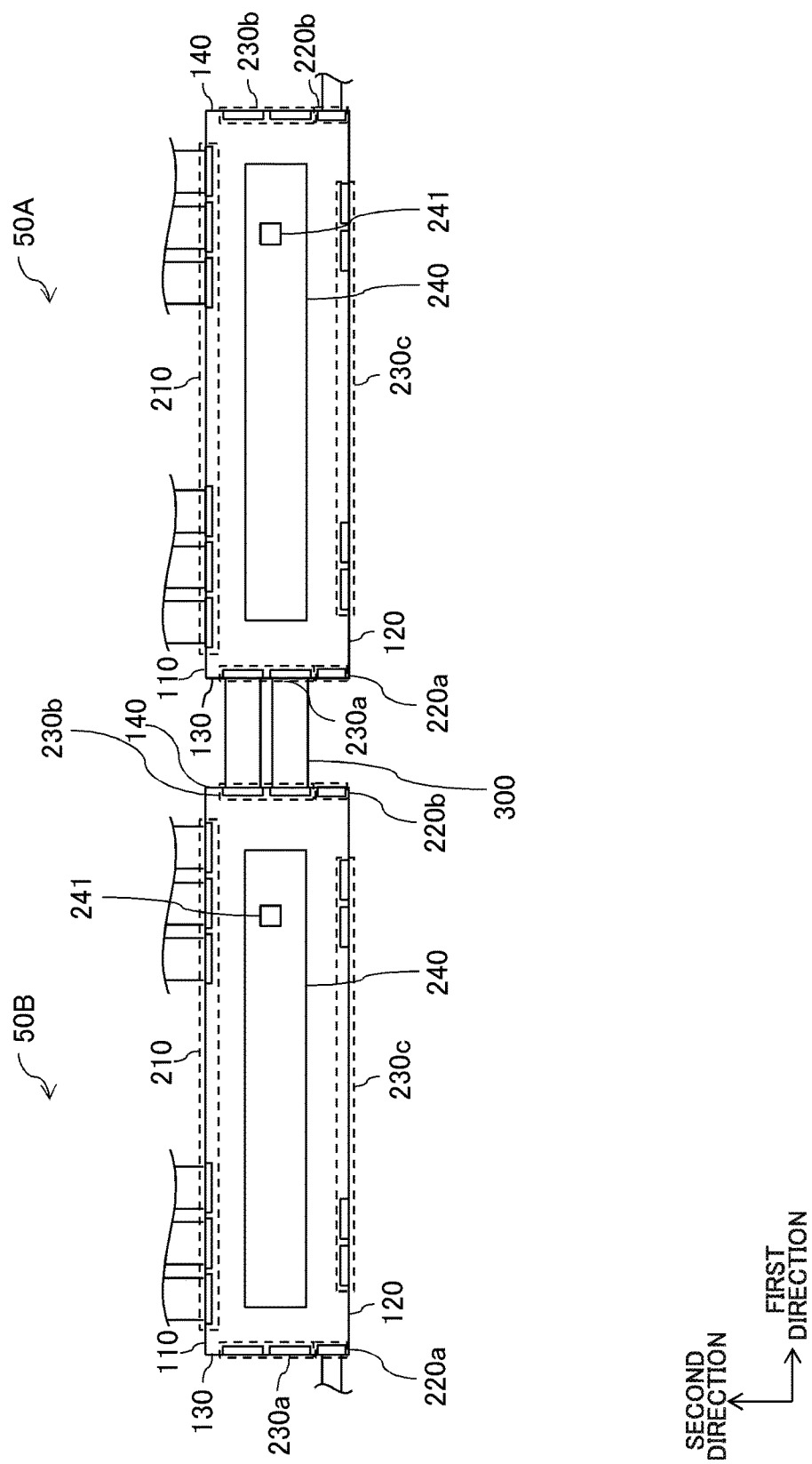
FIG. 7 is a view illustrating a schematic configuration of the plurality of control circuit substrates arrayed only in the first direction of the exemplary embodiment.

In FIG. 2, four control circuit substrates 50 are arrayed in the first and second directions. However, liquid crystal display device 1 is not limited to the configuration in FIG. 2. For example, liquid crystal display device 1 may have a configuration in which the plurality of control circuit substrates 50 are arrayed in the first direction. FIG. 7 is a view illustrating a schematic configuration of the plurality of control circuit substrates 50 arrayed only in the first direction. FIG. 7 illustrates two control circuit substrates 50 (control circuit substrates 50A and 50B) adjacent to each other in the first direction. Control circuit substrates 50A and 50B in FIG. 7 differs from control circuit substrates 50A and 50B in FIG. 4 only in the configuration of third substrate connecting part 230c. Accordingly, the configuration equivalent to that in FIG. 4 is designated by the same symbol, and the overlapping description is omitted. In FIG. 7, substrate connecting wiring 300 is not electrically connected to third substrate connecting part 230c of control circuit substrate 50A and third substrate connecting part 230c of control circuit substrate 50B, but third substrate connecting part 230c and third substrate connecting part 230c are in the non-use state. Third substrate connecting part 230c of control circuit substrate 50A and third substrate connecting part 230c of control circuit substrate 50B may electrically be connected to each other through substrate connecting wiring 300. In control circuit substrates 50A and 50B, third substrate connecting part 230c of control circuit substrate 50A and third substrate connecting part 230c of control circuit substrate 50B may not be disposed.

In each of two control circuit substrates 50A and 50B adjacent to each other in the first direction, the gate connecting wiring is electrically connected to one of first gate connecting part 220a and second gate connecting part 220b, and the gate connecting wiring is not electrically connected to the other. In each of control circuit substrates 50A and 50B adjacent to each other in the first direction, substrate connecting wiring 300 is not electrically connected to two of first substrate connecting part 230a, second substrate connecting part 230b, and third substrate connecting part 230c.

Figure 8:
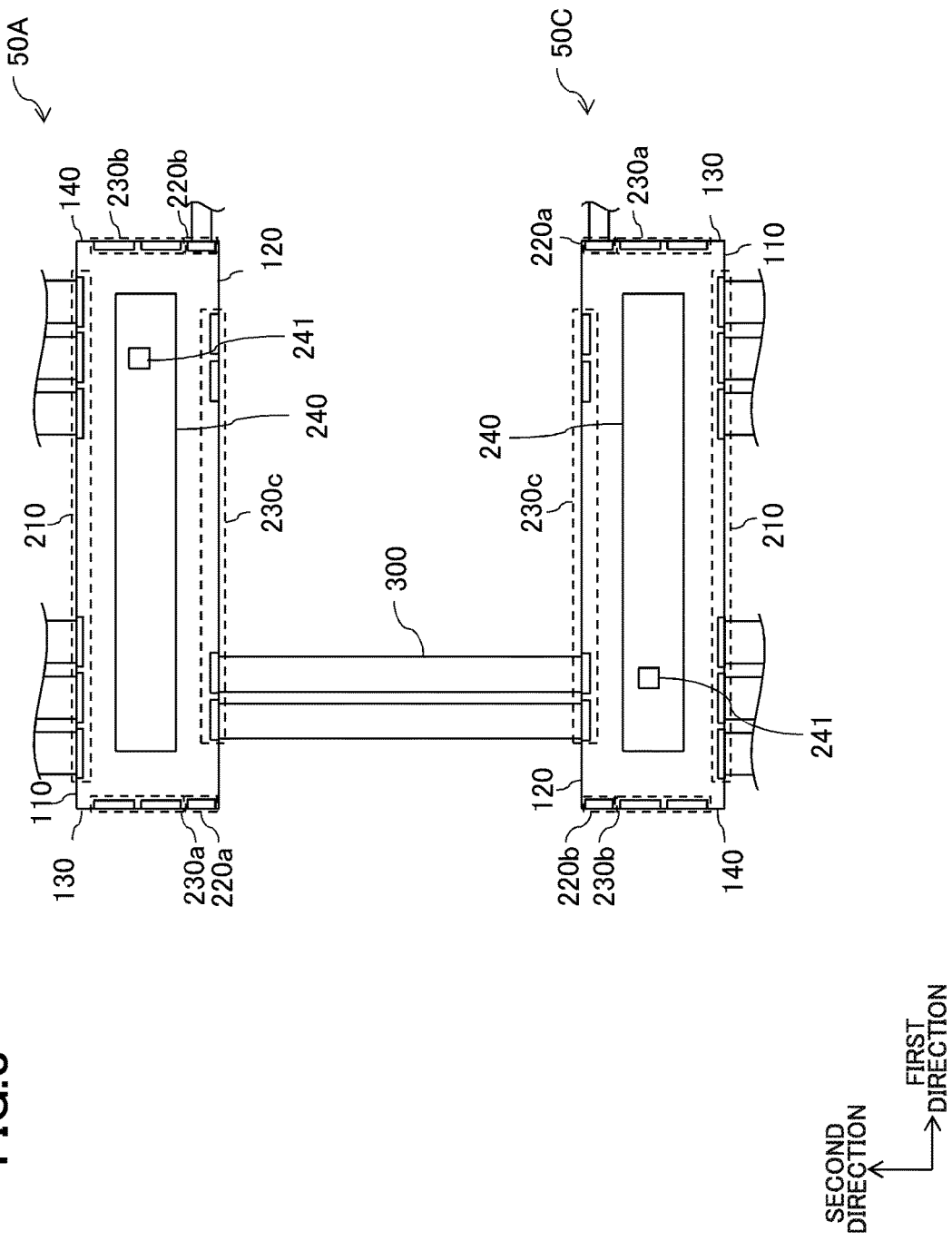
FIG. 8 is a view illustrating a schematic configuration of the plurality of control circuit substrates arrayed only in the second direction of the exemplary embodiment.

Liquid crystal display device 1 may have a configuration in which the plurality of control circuit substrates 50 are arrayed only in the second direction. FIG. 8 is a view illustrating a schematic configuration of the plurality of control circuit substrates 50 arrayed only in the second direction. FIG. 8 illustrates two control circuit substrates 50 (control circuit substrates 50A and 50C) adjacent to each other in the second direction. Control circuit substrates 50A and 50C in FIG. 8 differs from control circuit substrates 50A and 50C in FIG. 5 only in the configurations of first substrate connecting part 230a and second substrate connecting part 230b. Accordingly, the configuration equivalent to that in FIG. 5 is designated by the same symbol, and the overlapping description is omitted. In FIG. 8, substrate connecting wiring 300 is not electrically connected to first substrate connecting part 230a of control circuit substrate 50A and second substrate connecting part 230b of control circuit substrate 50C, but first substrate connecting part 230a and second substrate connecting part 230b are in the non-use state.

In each of control circuit substrates 50A and 50C adjacent to each other in the second direction, the gate connecting wiring is electrically connected to one of first gate connecting part 220a and second gate connecting part 220b, and the gate connecting wiring is not electrically connected to the other. First substrate connecting part 230a or second substrate connecting part 230b of control circuit substrate 50A and first substrate connecting part 230a or second substrate connecting part 230b of control circuit substrate 50C may electrically be connected to each other through substrate connecting wiring 300. In each of control circuit substrates 50A and 50C adjacent to each other in the second direction, substrate connecting wiring 300 is not electrically connected to two of first substrate connecting part 230a, second substrate connecting part 230b, and third substrate connecting part 230c.

Figure 9:
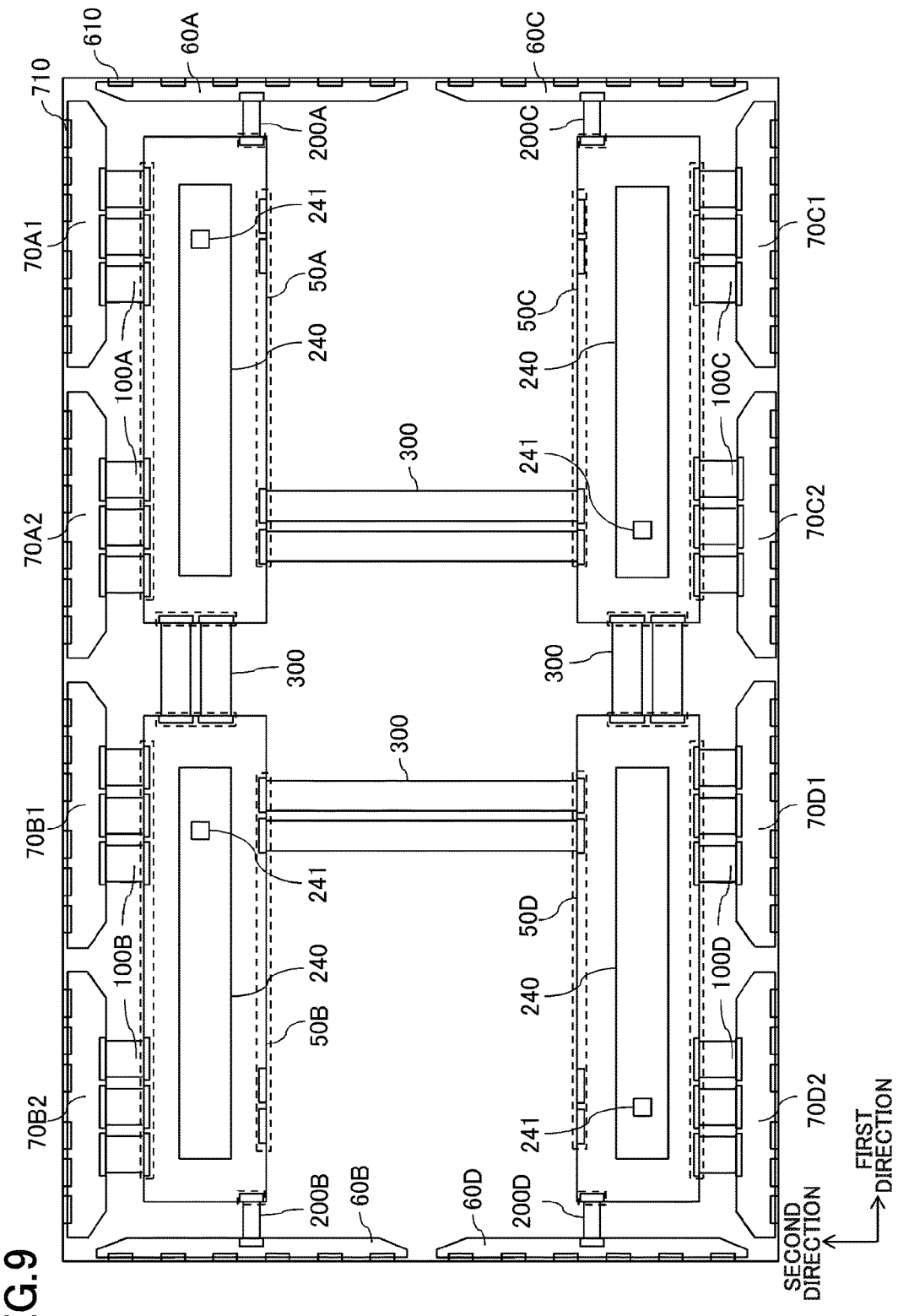
FIG. 9 is a rear view illustrating a display panel according to a modification of the exemplary embodiment.
Figure 10:
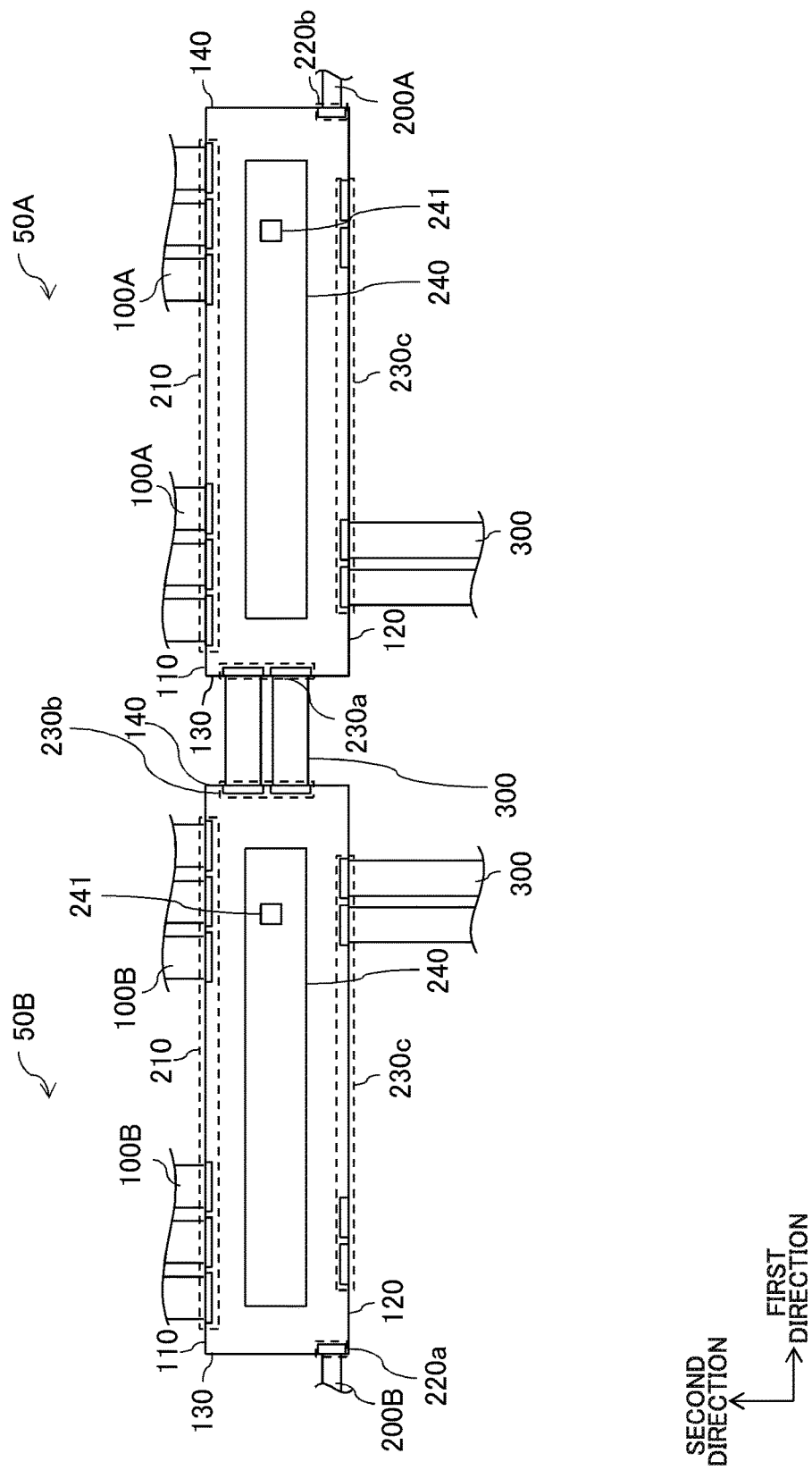
FIG. 10 is a view illustrating a schematic configuration of the plurality of control circuit substrates adjacent to each other in the first direction of the modification of the exemplary embodiment.

In the above description, each of four control circuit substrates 50 in FIG. 2 has the configuration equivalent to control circuit substrate 50A in FIG. 3. However, control circuit substrate 50 is not limited to the configuration equivalent to control circuit substrate 50A in FIG. 3. A liquid crystal display device 1 according to a modification of the exemplary embodiment will be described below with reference to FIGS. 9 and 10. FIG. 9 is a rear view illustrating display panel 10. FIG. 10 is a view illustrating a schematic configuration of the plurality of control circuit substrates 50 (control circuit substrates 50A and 50B) adjacent to each other in the first direction shown in FIG. 9. For convenience, only control circuit substrates 50A and 50B in FIG. 9 and the wirings connected to the control circuit substrates of control circuit substrates 50A and 50B are illustrated in FIG. 10. Control circuit substrates 50A and 50B in FIG. 10 differ from control circuit substrates 50A and 50B in FIG. 4 only in the configuration of control circuit substrate 50. Accordingly, the configuration equivalent to that in FIG. 4 is designated by the same symbol, and the overlapping description is omitted.

Referring to FIG. 10, control circuit substrate 50A includes data connecting part 210, second gate connecting part 220b, first substrate connecting part 230a, and third substrate connecting part 230c. Data connecting part 210 is disposed on the side of first long side 110, and data connecting wiring 100A is electrically connected to data connecting part 210. Second gate connecting part 220b is disposed on the side of second short side 140, and gate connecting wiring 200A is electrically connected to second gate connecting part 220b. First substrate connecting part 230a is disposed on the side of first short side 130, and substrate connecting wiring 300 is electrically connected to first substrate connecting part 230a. Third substrate connecting part 230c is disposed on the side of second long side 120, and substrate connecting wiring 300 is electrically connected to third substrate connecting part 230c. Thus, in control circuit substrate 50A of the modification, the connecting wiring is connected to all the connecting parts. When control circuit substrate 50A is viewed in the long side direction (the first direction) from first short side 130 toward second short side 140, second gate connecting part 220b and first substrate connecting part 230a are disposed so as not to overlap each other. That is, second gate connecting part 220b and first substrate connecting part 230a do not superpose each other in the direction (the first direction) perpendicular to first short side 130. Control circuit substrate 50B includes data connecting part 210, first gate connecting part 220a, first substrate connecting part 230a, and third substrate connecting part 230c. Data connecting part 210 is disposed on the side of first long side 110, and data connecting wiring 100B is electrically connected to data connecting part 210. First gate connecting part 220a is disposed on the side of first short side 130, and gate connecting wiring 200B is electrically connected to first gate connecting part 220a. Second substrate connecting part 230b is disposed on the side of second short side 140, and substrate connecting wiring 300 is electrically connected to second substrate connecting part 230b. Third substrate connecting part 230c is disposed on the side of second long side 120, and substrate connecting wiring 300 is electrically connected to third substrate connecting part 230c. Thus, in control circuit substrate 50B of the modification, the connecting wiring is connected to all the connecting parts. When control circuit substrate 50B is viewed in the long side direction (the first direction) from first short side 130 toward second short side 140, first gate connecting part 220a and second substrate connecting part 230b are disposed so as not to overlap each other. That is, first gate connecting part 220a and second substrate connecting part 230b do not superpose each other in the direction (the first direction) perpendicular to first short side 130.

Control circuit substrates 50A and 50D of the modification are disposed such that the positions of data connecting part 210, gate connecting part 220, and substrate connecting part 230 in control circuit substrate 50A and the positions of data connecting part 210, gate connecting part 220, and substrate connecting part 230 in control circuit substrate 50C are symmetrical about a point. Control circuit substrates 50B and 50C of the modification are disposed such that the positions of data connecting part 210, gate connecting part 220, and substrate connecting part 230 in control circuit substrate 50A and the positions of data connecting part 210, gate connecting part 220, and substrate connecting part 230 in control circuit substrate 50C are symmetrical about a point.

Thus, the production cost of liquid crystal display device 1 can be suppressed by arranging the two sets (control circuit substrates 50A and 50D, control circuit substrates 50B and 50C) of control circuit substrates 50 that have substantially the same shape and the similar configuration as illustrated in FIG. 9.

A configuration of control circuit 240 mounted on control circuit substrate 50 will be described below. Each of control circuits 240 mounted on the plurality of control circuit substrates 50 may have the same configuration or different configurations. For example, control circuit 240 in one of the plurality of control circuit substrates 50 may include specific component 241, but control circuits 240 of other control circuit substrates 50 may not include specific component 241. In liquid crystal display device 1 of the exemplary embodiment including the plurality of control circuit substrates 50, it is necessary to synchronize operations of the plurality of control circuits 240 with each other in order to display the image on display panel 10. Therefore, one of the plurality of control circuit substrates 50 includes a timing signal generating circuit that generates a timing signal (for example, a reference clock) in order to synchronize the operations of the plurality of control circuits 240 with each other as specific component 241. Power is supplied to each of the plurality of control circuits 240.

For example, as illustrated in FIG. 2, it is assumed that control circuit substrate 50A that is located on the upper right when viewed from the rear surface of display panel 10 includes the timing signal generating circuit as specific component 241. In this case, the timing signal generated with the timing signal generating circuit of control circuit substrate 50A is input to control circuit 240 of control circuit substrate 50C through substrate connecting wiring 300 that electrically connects control circuit substrates 50A and 50C to each other. The timing signal input to control circuit 240 of control circuit substrate 50C is input to control circuit 240 of control circuit substrate 50D through substrate connecting wiring 300 that electrically connects control circuit substrates 50C and 50D to each other. The timing signal generated with the timing signal generating circuit of control circuit substrate 50A is input to control circuit 240 of control circuit substrate 50B through substrate connecting wiring 300 that electrically connects control circuit substrates 50A and 50B to each other. Each of control circuits 240 of control circuit substrates 50A to 50D operates on the basis of the timing signal generated with the timing signal generating circuit of control circuit substrate 50A. Specifically, for example, each control circuit 240 generates the control signal (such as a starting pulse and a clock) in order to control gate line driving circuit 610 and data line driving circuit 710 on the basis of the timing signal. The timing signal input to control circuit 240 of control circuit substrate 50B may be input to control circuit 240 of control circuit substrate 50D through substrate connecting wiring 300 that electrically connects control circuit substrates 50B and 50D to each other.

Each of the plurality of control circuit substrates 50 may include the timing signal generating circuit as specific component 241. In this case, a function of the timing signal generating circuit included in one of the plurality of control circuit substrates 50 is enabled (function is on), and functions of the timing signal generating circuits included in other control circuit substrates 50 are disabled (function is off).

A specific configuration of gate line driving circuit substrate 60 will be described below with gate line driving circuit substrate 60A as an example. Although gate line driving circuit substrate 60A is cited as an example, the same holds true for gate line driving circuit substrates 60B to 60D.

Figure 11:
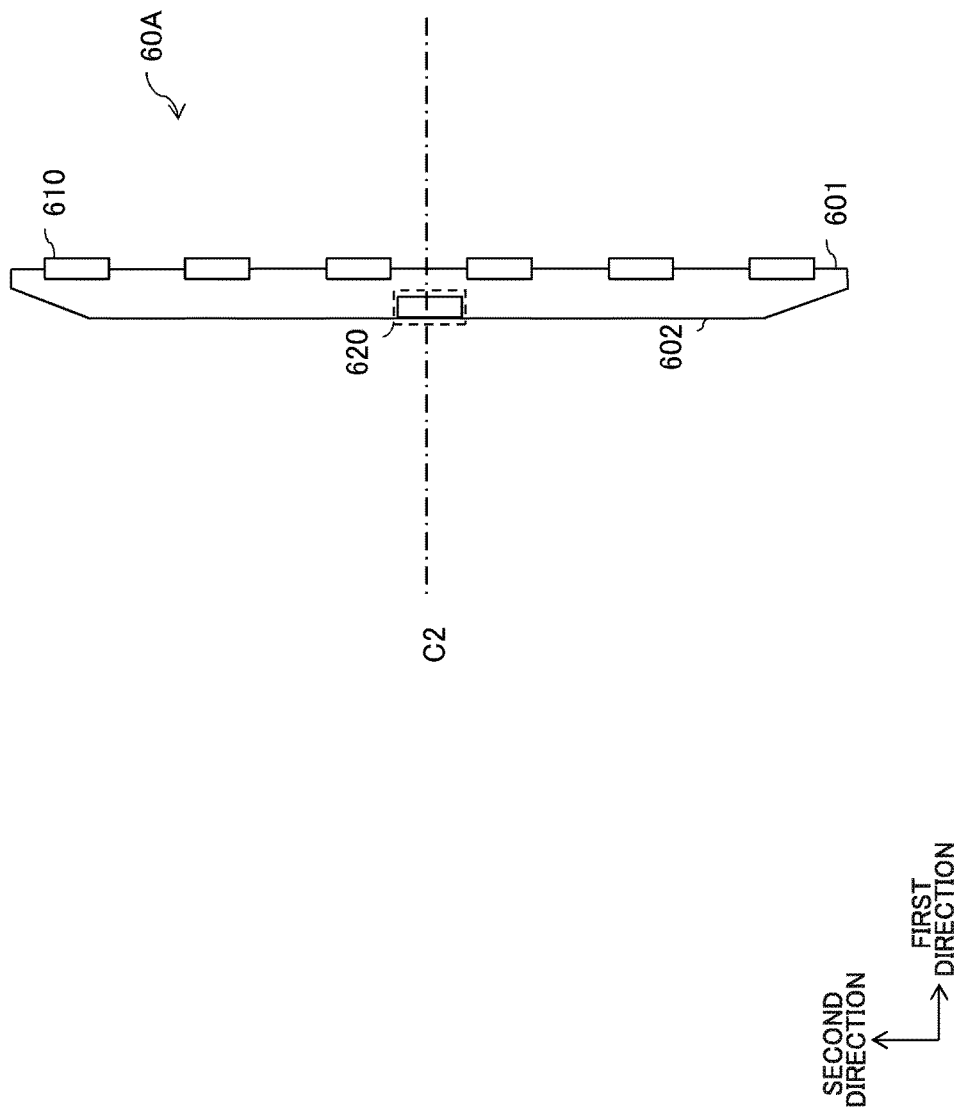
FIG. 11 is a view illustrating a schematic configuration of a gate line driving circuit substrate of the exemplary embodiment.

FIG. 11 is a view illustrating a schematic configuration of gate line driving circuit substrate 60A of the exemplary embodiment. As illustrated in FIG. 11, gate line driving circuit substrate 60A is a printed circuit substrate including two short sides extending in the first direction, two long sides extending in the second direction, and two oblique sides extending in oblique directions. For example, gate line driving circuit substrate 60A includes gate line driving circuit 610 and gate connecting part 620.

Gate line driving circuit 610 is a circuit that supplies the gate signal to the gate line included in TFT substrate 12, and gate line driving circuit 610 is disposed on the side of first long side 601 of gate line driving circuit substrate 60A. In the exemplary embodiment, the plurality of gate line driving circuits 610 are arrayed in line along first long side 601 of gate line driving circuit substrate 60A.

Gate connecting part 620 is a region that is connected to one or the plurality of gate connecting wirings that electrically connect control circuit substrate 50A and gate line driving circuit 610 to each other. Gate connecting part 620 is disposed on the side of second long side 602 of gate line driving circuit substrate 60A.

In gate line driving circuit substrate 60A of FIG. 11, gate line driving circuit 610 and gate connecting part 620 are symmetrically disposed in relation to center line C2 in the long side direction (the second direction) of gate line driving circuit substrate 60A. Gate line driving circuit substrate 60A may have any shape as long as gate line driving circuit 610 and gate connecting part 620 are symmetrically disposed in relation to center line C2 in the long side direction of gate line driving circuit substrate 60A.

Thus, the production cost of liquid crystal display device 1 can be suppressed by arranging the plurality of gate line driving circuit substrates 60 that have substantially the same shape and the similar configuration.

A specific configuration of data line driving circuit substrate 70 will be described below with data line driving circuit substrate 70A1 as an example. Although data line driving circuit substrate 70A1 is cited as an example, the same holds true for data line driving circuit substrates 70A2 to 70D2.

Figure 12:
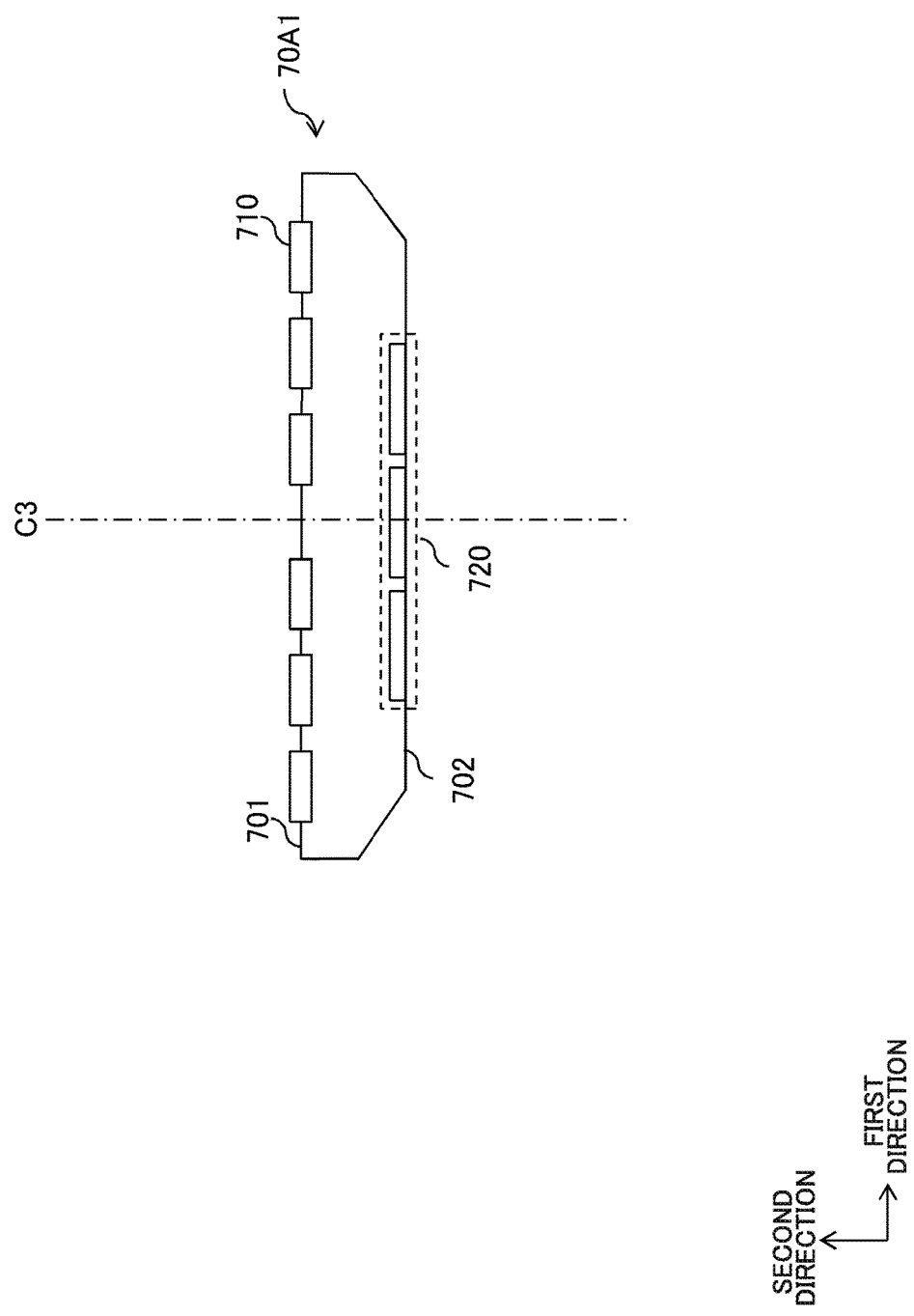
FIG. 12 is a view illustrating a schematic configuration of a data line driving circuit substrate of the exemplary embodiment.

FIG. 12 is a view illustrating a schematic configuration of data line driving circuit substrate 70A1. As illustrated in FIG. 12, data line driving circuit substrate 70A1 is a printed circuit substrate including two long sides extending in the first direction, two short sides extending in the second direction, and two oblique sides extending in oblique directions. For example, data line driving circuit substrate 70A1 includes data line driving circuit 710 and data connecting part 720.

Data line driving circuit 710 is a circuit that supplies the data signal to the data line included in TFT substrate 12, and data line driving circuit 710 is disposed on the side of first long side 701 of data line driving circuit substrate 70A1. In the exemplary embodiment, the plurality of data line driving circuits 710 are arrayed in line along first long side 701 of data line driving circuit substrate 70A1.

Data connecting part 720 is a region that is connected to one or the plurality of gate connecting wirings that electrically connect control circuit substrate 50A and data line driving circuit 710 to each other. Data connecting part 720 is disposed on the side of second long side 702 of data line driving circuit substrate 70A1.

In data line driving circuit substrate 70A1 of FIG. 12, data line driving circuit 710 and data connecting part 720 are symmetrically disposed in relation to center line C3 in the long side direction (the first direction) of data line driving circuit substrate 70A1. Data line driving circuit substrate 70A1 may have any shape as long as data line driving circuit 710 and data connecting part 720 are symmetrically disposed in relation to center line C3 in the long side direction of data line driving circuit substrate 70A1.

Thus, the production cost of liquid crystal display device 1 can be suppressed by arranging the plurality of gate line driving circuit substrates 60 that have substantially the same shape and the similar configuration.

Gate line driving circuit substrate 60A in FIG. 11 is formed into a shape in which both corner portions on the side of second long side 602 are notched. Similarly, data line driving circuit substrate 70A1 in FIG. 12 is formed into the shape in which both the corner portions on the side of second long side 702 are notched. Therefore, gate line driving circuit substrate 60 and data line driving circuit substrate 70 (for example, gate line driving circuit substrate 60A and data line driving circuit substrate 70A1), which are disposed at right angles in the corner portion of display panel 10, can be prevented from interfering with each other. Consequently, a freedom degree of the dispositions of gate line driving circuit substrate 60 and data line driving circuit substrate 70 can be enhanced.

In the above, the specific embodiments of the present application have been described, but the present application is not limited to the above-mentioned embodiments, and various modifications may be made as appropriate without departing from the spirit of the present application.

What is claimed is:

1. A display device comprising:
   a display panel including a plurality of gate lines extending in a first direction and a plurality of data lines extending in a second direction;
   a plurality of control circuit substrates disposed in a rear surface of the display panel, each of the control circuit substrates having a control circuit mounted thereon that generates a control signal for controlling at least one of a plurality of data line driving circuits and at least one of a plurality of gate line driving circuits;
   a plurality of gate connecting wirings each of which electrically connects a respective one of the control circuit substrates to a corresponding one of the gate line driving circuits; and
   a substrate connecting wiring that electrically connects two of the control circuit substrates which are adjacent to each other,
   wherein each of the control circuit substrates includes:
      a first-side gate connecting part disposed on a first side of the control circuit substrate, and capable of being electrically connected to one of the gate connecting wirings; and
      a second-side substrate connecting part disposed on a second side of the control circuit substrate, and capable of being electrically connected to the substrate connecting wiring, the second side of the control circuit substrate being opposed to the first side of the control circuit substrate, and
   for each of the control circuit substrates, the first-side gate connecting part and the second-side substrate connecting part are disposed so as not to overlap each other when the control circuit substrate is viewed from the first side of the control circuit substrate toward the second side of the control circuit substrate along the first direction.

2. The display device according to claim 1, wherein each of the control circuit substrates further includes:
   a first-side substrate connecting part disposed on the first side of the control circuit substrate, and is capable of being electrically connected to the substrate connecting wiring; and
   a second-side gate connecting part disposed on the second side of the control circuit substrate, and is capable of being electrically connected to the gate connecting wiring.

3. The display device according to claim 2, wherein the two control circuit substrates which are adjacent to each other are electrically connected to each other through the substrate connecting wiring electrically connected to one of the first-side substrate connecting part and the second-side substrate connecting part, and
   in each of the control circuit substrates, the gate connecting wiring is electrically connected to one of the first-side gate connecting part and the second-side gate connecting part, and the gate connecting wiring is not electrically connected to the other of the first-side gate connecting part and the second-side gate connecting part.

4. The display device according to claim 2, wherein each of the control circuit substrates further comprises a third-side substrate connecting part disposed on a third side of the control circuit substrate, the third side of the control circuit substrate extending from the first side of the control circuit substrate to the second side of the control circuit substrate, and the third-side substrate connecting part capable of being electrically connected to the substrate connecting wiring, wherein the two control circuit substrates which are adjacent to each other are electrically connected to each other through the substrate connecting wiring electrically connected to at least one of the first-side substrate connecting part, the second-side substrate connecting part, and the third-side substrate connecting part, and in each of the control circuit substrates, the substrate connecting wiring is not electrically connected to one or two of the first-side substrate connecting part, the second-side substrate connecting part, and the third-side substrate connecting part.

5. The display device according to claim 4, wherein the third-side substrate connecting part includes two substrate connecting parts arrayed along the third side of the control circuit substrate, and in each of the control circuit substrates, the substrate connecting wiring is electrically connected to one of the two substrate connecting parts, and the substrate connecting wiring is not electrically connected to the other of the two substrate connecting parts.

6. The display device according to claim 2, further comprising a plurality of data connecting wirings each of which electrically connects, for each of the control circuit substrates, the control circuit substrate and the data line driving circuit to each other, wherein each of the control circuit substrates further includes a data connecting part that is disposed on a fourth side of the control circuit substrate, the fourth side of the control circuit substrate extending from the first side of the control circuit substrate to the second side of the control circuit substrate, the data connecting wiring being electrically connected to the data connecting part, and in each of the control circuit substrates, the data connecting part is symmetrically disposed in relation to a center line of a direction of the fourth side of the control circuit substrate, the first-side gate connecting part and the second-side gate connecting part are symmetrically disposed in relation to the center line of the direction of the fourth side of the control circuit substrate, and the first-side substrate connecting part and the second-side substrate connecting part are symmetrically disposed in relation to the center line of the direction of the fourth side of the control circuit substrate.

7. The display device according to claim 2, wherein the plurality of control circuit substrates includes a first control circuit substrate and a second control circuit substrate, the first control circuit substrate and the second control circuit substrate are adjacent to each other in the first direction, and are disposed such that the first side of the first control circuit substrate and the second side of the second control circuit substrate face each other, and the first control circuit substrate and the second control circuit substrate are disposed such that positions of the first-side gate connecting part, the second-side gate connecting part, the first-side substrate connecting part, and the second-side substrate connecting part in the first control circuit substrate and positions of the first-side gate connecting part, the second-side gate connecting part, the first-side substrate connecting part, and the second-side substrate connecting part in the second control circuit substrate are translated to each other in the first direction.

8. The display device according to claim 2, wherein the plurality of control circuit substrates includes a first control circuit substrate and a second control circuit substrate, the first control circuit substrate and the second control circuit substrate are adjacent to each other in the second direction, and are disposed such that the third side of the first control circuit substrate and the third side of the second control circuit substrate face each other, and the first control circuit substrate and the second control circuit substrate are disposed such that positions of the first-side gate connecting part, the second-side gate connecting part, the first-side substrate connecting part, and the second-side substrate connecting part in the first control circuit substrate and positions of the first-side gate connecting part, the second-side gate connecting part, the first-side substrate connecting part, and the second-side substrate connecting part in the second control circuit substrate are symmetrical about a point.

9. The display device according to claim 1, further comprising a plurality of data line driving circuit substrates on each of which is mounted a respective one of the data line driving circuits; and a plurality of gate line driving circuit substrates on each of which is mounted a respective one of the gate line driving circuits, wherein each of the data line driving circuit substrates is symmetrically formed in relation to a center line in the first direction, and each of the gate line driving circuit substrates is symmetrically formed in relation to the center line in the first direction.

10. The display device according to claim 1, wherein one of the plurality of control circuit substrates includes a timing signal generating circuit that generates a timing signal in order to synchronize operations of the plurality of control circuits mounted on the plurality of control circuit substrates with each other, and each of the control circuits of the plurality of control circuit substrates operates based on the generated timing signal.

11. The display device according to claim 1, wherein a specific component is mounted on one of the plurality of control circuit substrates, and the specific component is not mounted on other ones of the plurality of control circuit substrates.

12. The display device according to claim 11, wherein the specific component is a timing signal generating circuit that generates a timing signal in order to synchronize operations of the plurality of control circuits mounted on the plurality of control circuit substrates with each other.

13. The display device according to claim 1, wherein each of the control circuit substrates includes a timing signal generating circuit that generates a timing signal in order to synchronize operations of the plurality of control circuits mounted on the plurality of control circuit substrates, a function of the timing signal generating circuit mounted on one of the plurality of control circuit substrates is enabled, and functions of the timing signal generating circuits mounted on other ones of the plurality of control substrate circuits are disabled.

14. A display device comprising:

a display panel including a plurality of gate lines extending in a first direction and a plurality of data lines extending in a second direction;

four control circuit substrates arranged in a matrix shape in the first and second directions in a rear surface of the display panel, each of the control circuit substrates having a control circuit mounted thereon that generates a control signal for controlling at least one of a plurality of data line driving circuits and at least one of a plurality of gate line driving circuits;

a plurality of gate connecting wirings each of which electrically connects a respective one of the control circuit substrates to a corresponding one of the gate line driving circuits; and a plurality of substrate connecting wirings that electrically connect two of the control circuit substrates which are adjacent to each other in the second direction, and electrically connect two of the control circuit substrates which are adjacent to each other in the first direction, wherein each of the control circuit substrates includes:

a first-side gate connecting part and a first-side substrate connecting part, the first-side gate connecting part and the first-side substrate connecting part being disposed on a first side of the control circuit substrate, the first-side gate connecting part being capable of being electrically connected to the gate connecting wirings, the first-side substrate connecting part being capable of electrically connected to the substrate connecting wiring;

a second-side gate connecting part and a second-side substrate connecting part, the second-side gate connecting part and the second-side substrate connecting part being disposed on a second side of the control circuit substrate facing the first side of the control circuit substrate, the second-side gate connecting part being capable of being electrically connected to the gate connecting wiring, the second-side substrate connecting part being capable of being electrically connected to the substrate connecting wiring; and a third-side substrate connecting part disposed on a third side of the control circuit substrate which extends from the first side of the control circuit substrate to the second side of the control circuit substrate, the third-side substrate connecting part being electrically connected to the substrate connecting wiring, the two control circuit substrates which are adjacent to each other in the second direction are electrically connected to each other through the substrate connecting wiring electrically connected to the third-side substrate connecting part, and in each of the control circuit substrates, the gate connecting wiring is electrically connected to one of the first-side gate connecting part and the second-side gate connecting part, and the gate connecting wiring is not electrically connected to the other of the first-side gate connecting part and the second-side gate connecting part, and the substrate connecting wiring is electrically connected to one of the first-side substrate connecting part and the second-side substrate connecting part, and the substrate connecting wiring is not electrically connected to the other of the first-side substrate connecting part and the second-side substrate connecting part.

15. The display device according to claim 14, wherein in each of the control circuit substrates, when the gate connecting wiring is electrically connected to the first-side gate connecting part while not electrically connected to the second-side gate connecting part, the substrate connecting wiring is electrically connected to the second-side substrate connecting part, while not electrically connected to the first-side substrate connecting part, and when the gate connecting wiring is electrically connected to the second-side gate connecting part while not electrically connected to the first-side gate connecting part, the substrate connecting wiring is electrically connected to the first-side substrate connecting part, while not electrically connected to the second-side substrate connecting part.

* * * * *